(12) United States Patent
Wu et al.

(10) Patent No.: US 7,117,409 B2
(45) Date of Patent: Oct. 3, 2006

(54) MULTI-PORT MEMORY TESTING METHOD UTILIZING A SEQUENCE FOLDING SCHEME FOR TESTING TIME REDUCTION

(75) Inventors: Cheng-Wen Wu, Hsinchu (TW);
Chih-Tsun Huang, Hsinchu (TW);
Chih-Wea Wang, Hsinchu (TW);
Kao-Liang Cheng, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 341 days.

(21) Appl. No.: 10/735,298

(22) Filed: Dec. 12, 2003

(65) Prior Publication Data

US 2004/0221109 A1    Nov. 4, 2004

(30) Foreign Application Priority Data

Apr. 15, 2003    (TW) ............... 92108725 A

(51) Int. Cl.
*G11C 20/10* (2006.01)
*G11C 7/22* (2006.01)

(52) U.S. Cl. ...................... 714/720; 365/201
(58) Field of Classification Search ............... 714/700, 714/702, 718–723, 707, 744, 814, 30; 365/200–201
See application file for complete search history.

(56) References Cited

U.S. PATENT DOCUMENTS 6,216,241 B1 *    4/2001   Fenstermaker et al. ..... 714/718

6,510,530 B1 *    1/2003   Wu et al. ...................... 714/30
6,563,751 B1 *    5/2003   Wu ............................. 365/201

FOREIGN PATENT DOCUMENTS

JP    10302475 A  * 11/1998
JP    11096765 A  *  4/1999

OTHER PUBLICATIONS

"Realistic Fault Models and Test Procedure for Multi-port SRAMs" by Hamdioui et al.☐☐IEEE International Workshop on Memory Technology, Design and Testing, Publication Date: 2001 On pp. 65-72 INSPEC Accession No. 7137971.*
"A Built-in Self-testing Method for Embedded Multiport Memory Arrays" by Narayanan et al. Proceedings of the 21st IEEE Instrumentation and Measurement Technology Conference Publication Date: May 18-20, 2004 vol. 3, On pp. 2027-2032.*
Chi-Feng Wu, et al., "Simulation-Based Test Algorithm Generation and Port Scheduling for Multi-Port Memories," Proceedings of the 38th Design Automation Conference, DAC 2001, Jun. 18-22, 2001, Las Vegas, NV, USA.

* cited by examiner

*Primary Examiner*—Cynthia Britt
(74) *Attorney, Agent, or Firm*—Ladas & Parry LLP

(57) ABSTRACT

In a method of testing a multi-port memory in accordance with a test pattern, test clock signals having the same test clock frequency but with different delay periods introduced therein are generated for controlling memory access through the different access ports of the memory. Consecutive memory operations of a test element of the test pattern are then conducted in a folded sequence upon a memory cell through the different access ports in accordance with the test clock signals such that the memory operations are completed within the same test clock cycle of the test element.

8 Claims, 3 Drawing Sheets

| | Extended March C-Test | TEST TIME |
|---|---|---|
| SINGLE PORT | PA: $\Updownarrow$(wa) $\Uparrow$(ra,wb) $\Uparrow$(rb,wa) $\Downarrow$(ra,wb,rb) $\Downarrow$(rb,wa,ra) $\Uparrow$(ra) | 12N |
| TWO-PORT | PA: $\Updownarrow$(wa) $\Uparrow$(ra) $\Uparrow$(rb) $\Downarrow$(ra,rb) $\Downarrow$(rb,ra) $\Uparrow$(ra)<br>PB: (—) (wb) (wa) (wb,—) (wa,—) (—) | 8N |
| THREE-PORT | PA: $\Updownarrow$(wa) $\Uparrow$(ra) $\Uparrow$(rb) $\Downarrow$(ra) $\Downarrow$(rb) $\Uparrow$(ra)<br>PB: (—) (wb) (wa) (wb) (wa) (—)<br>PC: (—) (—) (—) (rb) (ra) (—) | 6N |

FIG. 3

MULTI-PORT MEMORY TESTING METHOD UTILIZING A SEQUENCE FOLDING SCHEME FOR TESTING TIME REDUCTION

CROSS-REFERENCE TO RELATED APPLICATION

This application claims priority of Taiwanese application no. 092108725, filed on Apr. 15, 2003.

BACKGROUND OF THE INVENTION

1. Field of the Invention

The invention relates to a method of testing a multi-port memory, more particularly to a method of testing a multi-port memory using a sequence folding scheme to effectively reduce the testing time.

2. Description of the Related Art

System-on-chip (SOC) products generally incorporate hundreds of embedded memories, the size of which can occupy as much as 90% of the total chip area. Apart from memory capacity, the demand for data bandwidth in an SOC chip has increased as well. These led to the development of multi-port memories having a plurality of access ports that permit simultaneous access to memory cells. Multi-port memories are widely used in multiprocessor systems, network processors, graphic processing chips, devices with high performance requirements, etc., and are also found in data communication applications having different timing requirements. Therefore, in view of the increasing requirements for multi-port memories, technical problems of effective and rapid detection and diagnosis of defects in multi-port memories during the development phase, and of efficient testing during the mass production phase have become an important topic in the industry.

However, unlike a single-port memory, the multi-port memory provides parallel access paths that permit simultaneous access to different (or even the same) memory cells. In this sense, a multi-port memory differs very much from a single-port memory in architecture. Hence, an inter-port word line short or an inter-port bit line short in a multi-port memory will be more difficult to detect than damage in a conventional single-port memory. Accordingly, to promote efficiency in detecting damage in a multi-port memory, numerous test algorithms, including Zero-One, Checkerboard, CALPAT, Walking 1/0, Sliding Diagonal, Butterfly, and March algorithms, for a multi-port memory have been proposed in recent years. Among them, the March algorithm has proved to be superior in terms of testing efficiency. In accordance with different fault models of a multi-port memory, the basic March algorithm can be extended to result in other algorithms, such as MATS+, Marching 1/0, MATS++, March X, Match C+/C−, March A, March Y, March B, etc.

Taking the March C-algorithm as an example, the test pattern is: {↕ (wa); ↑ (ra, wb); ↑ (rb, wa); ↓ (ra, wb) ↓ (rb, wa); ↕(ra)}, where a=0 or 1, b=ā (i.e., inverse of a), w represents a write operation, r represents a read operation, ↕ represents that a memory write or read operation can be conducted in an ascending or descending order of memory addresses, ↑ represents that a memory write or read operation is conducted in the ascending order of the memory addresses, ↓ represents that a memory write or read operation is conducted in the descending order of the memory addresses, and ( ) indicates a test element that includes one or more memory operations, e.g., read a (ra), write b (wb), read b (rb), and write a (wa). Furthermore, the memory operations of a previous test element must be completed upon one of the memory cells (or memory addresses) before the memory operations of a succeeding test element can be performed upon said one of the memory cells (or memory addresses).

Therefore, assuming that a multi-port memory includes a pair of access ports A and B, when a test element ↑ (ra, wb) is to be executed, the prior art contemplates applying the consecutive memory operations (ra) and (wb) of the test element to each memory cell (or memory address) through the access port A, followed by applying the same memory operations (ra) and (wb) of the test element to each memory cell (or memory address) through the access port B. In this case, since each memory operation (ra) and (wb) requires at least one test clock cycle for completion, at least two test clock cycles are required when the memory operations of the test element ↑ (ra, wb) are conducted upon one of the memory cells (or memory addresses) through one of the access ports A or B. Since testing is actually conducted by treating the access ports A and B as individual ports, the test algorithm is executed twice such that one of the access ports A or B is idle when testing is conducted through the other of the access ports A or B.

In another conventional method of testing a multi-port memory, the consecutive memory operations (ra) and (wb) of the test element are applied to each memory cell (or memory address) by alternating between the access ports A and B. Particularly, the memory operation (ra) is applied through the access port A during a first test clock cycle, whereas the memory operation (wb) is applied through the access port B during a succeeding second test clock cycle. While two test clock cycles are still required when the memory operations of the test element ↑ (ra, wb) are conducted upon one of the memory cells (or memory addresses), it is no longer necessary to execute the test algorithm twice. However, one of the access ports A or B is still idle when testing is conducted through the other of the access ports A or B.

Since fault models of multi-port memories tend to be very complicated, corresponding complex algorithms are required for fault detection and testing. As a result, as capacities of multi-port memories become bigger, and as structures of multi-port memories grow in complexity, the test algorithms required also become more complicated, thereby resulting in a tremendous increase in testing time, which has an adverse affect on the testing efficiency of multi-port memories.

SUMMARY OF THE INVENTION

Therefore, the main object of the present invention is to provide a method of testing a multi-port memory using a sequence folding scheme to effectively reduce the testing time.

Another object of the present invention is to provide a computer program for causing a testing apparatus to perform steps of the method of the present invention.

According to one aspect of the present invention, there is provided a method of testing a multi-port memory in accordance with a test pattern. The memory includes a set of access ports and a plurality of memory cells accessible through the access ports. The access ports include at least first and second ports. The test pattern includes at least a test element that is to be performed upon each of the memory cells and that includes at least consecutive first and second memory operations. The method comprises:

a) generating a set of test clock signals that have the same test clock frequency, the test clock signals including at least a first test clock for controlling memory access through the first port, and a second test clock for controlling memory access through the second port, clock pulses of the second test clock lagging corresponding clock pulses of the first test clock by a delay period; and b) conducting the first and second memory operations in a folded sequence upon one of the memory cells during the same test clock cycle of the test element, wherein the first memory operation is conducted through the first port during a first time period starting from a leading edge of one of the clock pulses of the first test clock and ending at a lagging edge of said one of the clock pulses of the first test clock, and wherein the second memory operation is conducted through the second port during a second time period starting from a leading edge of one of the clock pulses of the second test clock and ending at a lagging edge of said one of the clock pulses of the second test clock.

The delay period has a duration sufficient to ensure that integrity of the first memory operation is not affected by the second memory operation and to ensure that the second time period overlaps the first time period such that the first and second memory operations are completed within the same test clock cycle of the test element.

According to another aspect of the present invention, there is provided a computer program comprising program instructions for causing a testing apparatus to perform steps of the aforesaid method of testing a multi-port memory in accordance with a test pattern.

BRIEF DESCRIPTION OF THE DRAWINGS

Other features and advantages of the present invention will become apparent in the following detailed description of the preferred embodiments with reference to the accompanying drawings, of which:

FIG. 3 is a table to compare testing times of the method of this invention with that of a conventional single-port testing scheme.

DETAILED DESCRIPTION OF THE PREFERRED EMBODIMENTS

The method of testing a multi-port memory according to the present invention is illustrated hereinafter using a test pattern generated in accordance with the aforesaid March C-algorithm to facilitate comparison with the conventional testing methods described hereinabove. However, it should be noted herein that the testing method of the present invention is not limited for application to March algorithms, and is actually applicable to other test algorithms having test elements that include multiple memory operations, such as MSCAN, Butterfly, etc.

Figure 1:
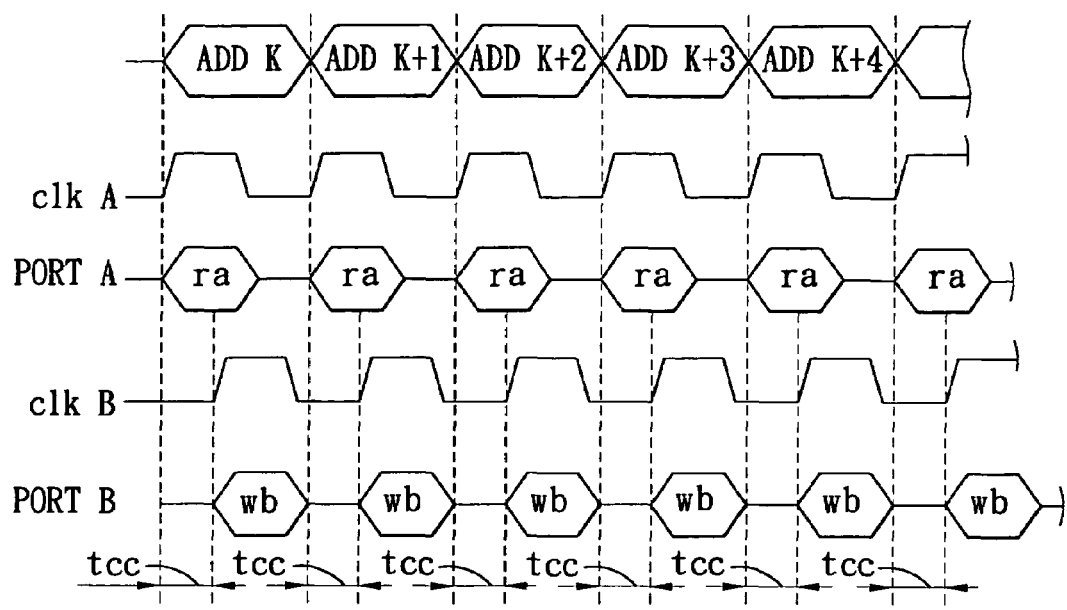
FIG. 1 is a timing diagram to illustrate the first preferred embodiment of a method of testing a two-port memory in accordance with a test pattern according to the present invention.

In the first preferred embodiment of this invention, the testing method is applied to a multi-port memory with a pair of access ports A and B, and a plurality of memory cells that are accessible through the access ports A and B in a conventional manner. In the present invention, consecutive memory operations of a test element, such as ↑ (ra, wb), of the test pattern are conducted in a folded sequence upon one of the memory cells (or memory addresses) through the access ports A and B during the same test clock cycle of the test element. As best shown in FIG. 1, the method of the first preferred embodiment comprises:

a) generating a set of test clock signals that have the same test clock frequency, the test clock signals including a first test clock (clk A) for controlling memory access through the access port A, and a second test clock (clk B) for controlling memory access through the access port B, clock pulses of the second test clock (clk B) lagging corresponding clock pulses of the first test clock (clk A) by a delay period (tcc); and b) conducting the memory operations (ra) and (wb) in the folded sequence upon one of the memory cells (or memory addresses) during the same test clock cycle of the test element, wherein the memory operation (ra) is conducted through the access port A during a first time period starting from a leading edge of one of the clock pulses of the first test clock (clk A) and ending at a lagging edge of said one of the clock pulses of the first test clock (clk A), and where in the memory operation (wb) is conducted through the access port B during a second time period starting from a leading edge of one of the clock pulses of the second test clock (clk B) and ending at a lagging edge of said one of the clock pulses of the second test clock (clk B).

It should be noted herein that the duration of the delay period (tcc) should not be less than a minimum specified duration of the two-port memory so as to ensure that integrity of the preceding memory operation (ra) is not affected by the succeeding memory operation (wb), and should be assigned properly to ensure that the second time period overlaps the first time period such that the two memory operations (ra) and (wb) are completed within the same test clock cycle (tcyc) of the test element.

Since the consecutive memory operations (ra, wb) of the test element ↑ (ra, wb) are conducted through the access ports A and B, respectively, under the control of two test clocks, e.g., clk A and clk B, the memory operations can be conducted in the folded sequence upon the same memory cell (or memory address k, k+1, k+2, ..., etc.) at different time points within the same test clock cycle (tcyc) of the test element ↑ (ra, wb). According to the method of the first preferred embodiment, the original March C-algorithm: {↕ (wa); ↑ (ra, wb); ↑ (rb, wa); ↓ (ra, wb); ↓ (rb, wa); ↕(ra)} is thus modified in the testing method of the first preferred embodiment into: {↕ (wa); ↕(ra)}, where $$\{\updownarrow(wa); \uparrow\binom{ra}{wb}; \uparrow\binom{rb}{wa}; \downarrow\binom{ra}{wb}; \downarrow\binom{rb}{wa}; \updownarrow(ra)\}, \text{ where} \binom{rb}{wa}$$

indicates that the memory operations (rb), (wa) are conducted upon the same memory cell (or memory address) through the access ports A and B within the same test clock cycle of the test element. The scheme utilized herein is hereinafter referred to as a sequence folding scheme. In this manner, the testing time of the two-port memory can be effectively reduced.

Figure 2:
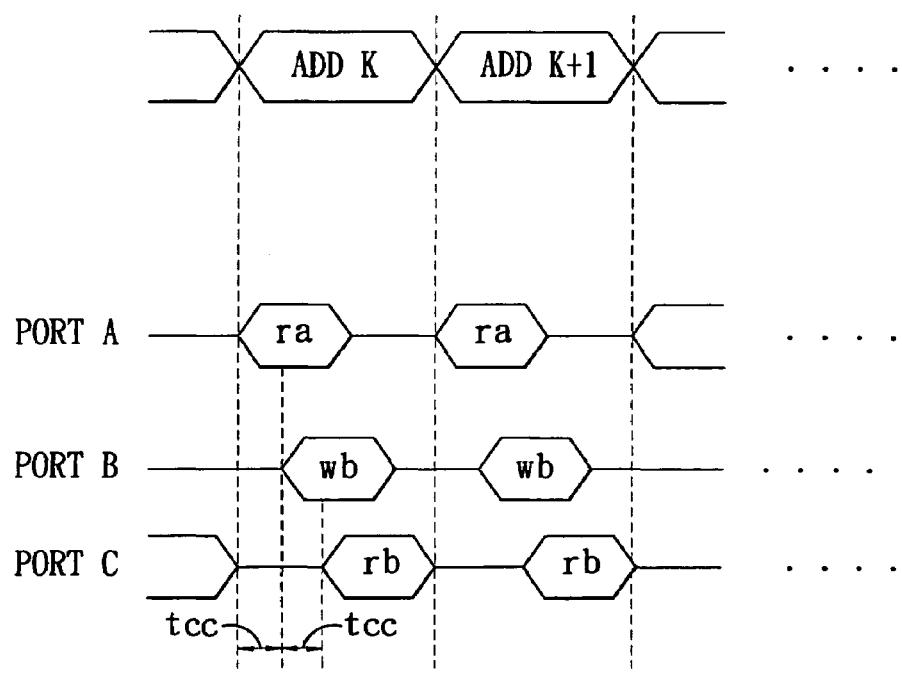
FIG. 2 is a timing diagram to illustrate the second preferred embodiment of a method of testing a three-port memory in accordance with a test pattern according to the present invention.

In the second preferred embodiment of this invention, the testing method is applied to a multi-port memory with three access ports A, B and C, and a plurality of memory cells that are accessible through the access ports A, B and C. Consecutive memory operations of a test element, such as ↑ (ra, wb, rb), of the test pattern are conducted in a folded sequence upon one of the memory cells (or memory addresses) through the access ports A, B and C during the same test clock cycle of the test element. As best shown in FIG. 2, unlike the method of the first preferred embodiment, the test clock signals generated in this embodiment further include a third test clock (clk C) for controlling memory access through the access port C, in which clock pulses of the third test clock (clk C) lag corresponding clock pulses of the second test clock (clk B) by a second delay period (tcc). Moreover, the third memory operation, i.e., (rb), is further conducted in the folded sequence upon the same memory cell as the first and second memory operations during the same test clock cycle of the test element, wherein the third memory operation is conducted through the access port C during a third time period starting from a leading edge of one of the clock pulses of the third test clock (clk C) and ending at a lagging edge of said one of the clock pulses of the third test clock (clk C).

Like the delay period (tcc) between corresponding clock pulses of the first and second test clocks (clk A and clk B), the second delay period (tcc) also has a duration sufficient to ensure that integrity of the second memory operation, i.e., (wb), is not affected by the third memory operation and to ensure that the third time period overlaps the second time period such that the first, second and third memory operations (ra, wb, rb) are completed within the same test clock cycle of the test element.

Therefore, it is evident from the foregoing that the larger the number of access ports of the multi-port memory, the greater will be the extent of testing time reduction when the method of this invention is in use. Referring to FIG. 3, taking the following Extended March C-algorithm as an example:

$\{\updownarrow (wa); \uparrow (ra, wb); \uparrow (rb, wa); \downarrow (ra, wb, rb); \downarrow (rb, wa, ra); \updownarrow (ra)\}$, when testing is conducted upon a single-port memory, or upon a multi-port memory where each memory operation requires a single test cycle, the total testing time is 12N, in which N is the size of the memory array. On the other hand, when testing is conducted upon a two-port memory using the sequence folding scheme of the first preferred embodiment of this invention, since consecutive memory operations of a test element are appropriately assigned to different ports A and B, the original test element ↑ (ra, wb) that requires two test clock cycles to complete is modified into a new test element $$\uparrow \begin{pmatrix} ra \\ wb \end{pmatrix}$$

which requires only one test clock cycle for completion, thereby reducing the testing time from 12N to 8N. Furthermore, when testing is conducted upon a three-port memory using the sequence folding scheme of the second preferred embodiment of this invention, since consecutive memory operations of a test element are appropriately assigned to the different ports A, B and C, the original test element ↓ (ra, wb, rb) that requires three clock cycles to complete is modified into a new test element $$\downarrow \begin{pmatrix} ra \\ wb \\ rb \end{pmatrix}$$

which also requires only one test clock cycle for completion, thereby reducing the testing time from 12N to 6N.

Figure 4:
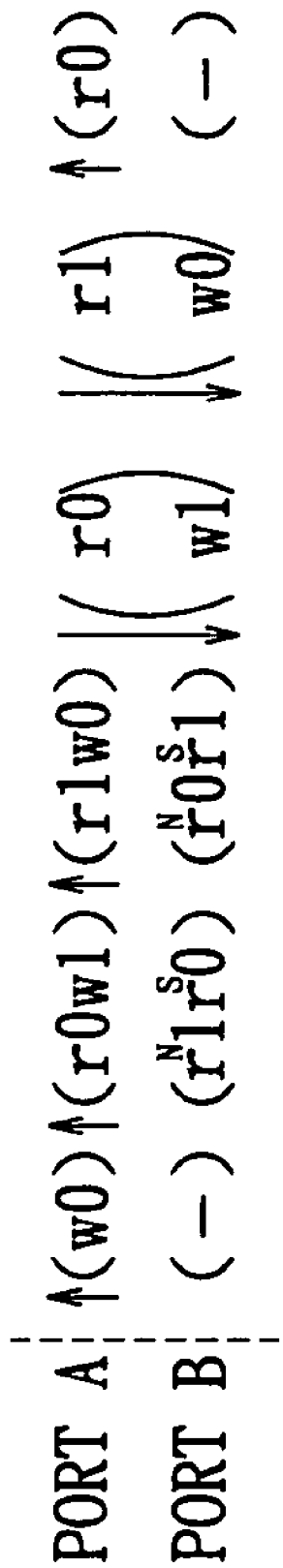
FIG. 4 is an example to illustrate an application of the method of the first preferred embodiment.

The method of the first preferred embodiment is applicable to a test algorithm proposed in Wu et al., "Simulation-Based Test Algorithm Generation and Port Scheduling for Multi-Port Memories," Proceedings of the 38$^{th}$ Design Automation Conference, DAC 2001, Jun. 18–22, 2001, Las Vegas, Nev., USA. In this paper, after port-scheduling to embed a test pattern for covering address decoder fault for each access port, and a test pattern for inter-port specific test, into a test pattern for covering stuck-at fault, transition fault, stuck-open fault, read disturbance fault, and coupling fault, redundancy reduction is performed to result in a compact algorithm having a test length of 10N. By employing the method of the first preferred embodiment in the compact algorithm proposed in the aforesaid paper, the modified compact algorithm is shown in FIG. 4 to have a test length of only 8N.

Preferably, the method of the present invention is performed by a testing apparatus loaded with a proprietary computer program that comprises program instructions for causing the testing apparatus to perform steps of the method of this invention. Alternatively, the method of the present invention is performed by a testing apparatus that includes a hardware circuit for causing the testing apparatus to perform steps of the method of this invention In summary, in the present invention, by generating test clock signals having the same test clock frequency but with different delay periods introduced therein for controlling memory access through the different access ports of a multi-port memory, and by conducting consecutive memory operations of a test element of a test pattern in a folded sequence upon a memory cell through the different access ports in accordance with the test clock signals, the memory operations can be completed within the same test clock cycle of the test element, thereby reducing testing time to a minimum.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A method of testing a multi-port memory in accordance with a test pattern, the memory including a set of access ports and a plurality of memory cells accessible through the access ports, the access ports including at least first and second ports, the test pattern including at least a test element that is to be performed upon each of the memory cells and that includes at least consecutive first and second memory operations, said method comprising:

a) generating a set of test clock signals that have the same test clock frequency, the test clock signals including at least a first test clock for controlling memory access through the first port, and a second test clock for controlling memory access through the second port, clock pulses of the second test clock lagging corresponding clock pulses of the first test clock by a first delay period; and b) conducting the first and second memory operations in a folded sequence upon one of the memory cells during the same test clock cycle of the test element, wherein the first memory operation is conducted through the first port during a first time period starting from a leading edge of one of the clock pulses of the first test clock and ending at a lagging edge of said one of the clock pulses of the first test clock, and wherein the second memory operation is conducted through the second port during, a second time period starting from a leading edge of one of the clock pulses of the second test clock and ending at a lagging edge of said one of the clock pulses of the second test clock; the first delay period having a duration sufficient to ensure that integrity of the first memory operation is not affected by the second memory operation and to ensure that the second time period overlaps the first time period such that the first and second memory operations are completed within the same test clock cycle of the test element.

2. The method as claimed in claim 1, the access ports further including a third port, the test element further including a third memory operation that follows the second test element, wherein: in step a), the test clock signals further include a third test clock for controlling memory access through the, third port, clock pulses of the third test clock lagging corresponding clock pulses of the second test clock by a second delay period; and in step b), the third memory operation is further conducted in the folded sequence upon said one of the memory cells during the same test clock cycle of the test element, wherein the third memory operation is conducted through the third port during a third time period, starting from a leading edge of one of the clock pulses of the third test clock and ending at a lagging edge of said one of the clock pulses of the third test clock; the second delay period having a duration sufficient to ensure that integrity of the second memory operation is not affected by the third memory operation and to ensure that the third time period overlaps the second time period such that the first, second and third memory operations are completed within the same test clock cycle of the test element.

3. The method as claimed in claim 1, wherein the test pattern is generated in accordance with a March algorithm.

4. The method as claimed in claim 1, wherein each of the memory operations is one of a read 1, operation, a write 0 operation, a read 0 operation and a write 1 operation.

5. A computer software product comprising a computer readable medium having stored thereon a computer program comprising program instructions for causing a testing apparatus to perform steps of a method of testing a multi-port memory in accordance with a test pattern, the memory including a set of access ports and a plurality of memory cells accessible through the access ports, the access ports including at least first and second ports, the test pattern including at least a test element that is to be performed upon each of the memory cells and that includes at least consecutive first and second memory operations, said instructions providing means for:

a) generating a set of test, clock signals that have the same test clock frequency, the test clock signals including at least a first test clock for controlling memory access through the first port, and a second test clock for controlling memory access through the second port, clock pulses of the second test clock lagging corresponding clock pulses of the first test clock by a first delay period; and b) conducting the first and second memory operations in a folded sequence upon one of the memory cells during the same test clock cycle of the test element, wherein the first memory operation is, conducted through the first port during a first time period starting from a leading edge of one of the clock pulses of the first test clock and ending at a lagging edge of said one of the clock pulses of the first test clock, and wherein the second memory operation is conducted through the second port during a second time period starting from a leading edge of one of the clock pulses of the second test clock and ending at a lagging edge of said one of the clock pulses of the second test clock; the first delay period having a duration sufficient to ensure that integrity of the first memory operation is not affected by the second memory operation and to ensure that the second time period overlaps the first time period such that the first and second memory operations are completed within the same test clock cycle of the test element.

6. The computer software product as claimed in claim 5, wherein the access ports further including a third port, the test element further including a third memory operation that follows the second test element, wherein the test clock signals generated by the generating means further include a third test clock for controlling memory access through the third port, clock pulses of the third test clock lagging corresponding clock pulses of the second test clock by a second delay period; and the third memory operation is further conducted in the folded sequence upon said one of the memory cells during the same test clock cycle of the test element, wherein the third memory operation is conducted through the third port during a third time period starting from a leading edge of one of the clock pulses of the third test clock and ending at a lagging edge of said one, of the clock, pulses of the third test clock; the second delay period having a duration sufficient to ensure that integrity of the second memory operation is not affected by the third memory operation and to ensure that the third time period overlaps the second time period such that the first, second and third memory operations are completed within the same test clock cycle of the test element.

7. The computer software product as claimed in claim 5, wherein the test pattern is generated in accordance with a March algorithm.

8. The computer software product as claimed in claim 5, wherein each of the memory operations is one of a read 1 operation, a write 0 operation, a read 0 operation and a write 1 operation.

* * * * *